United States Patent [19]
Leuthold

[11] 4,433,371
[45] Feb. 21, 1984

[54] CONVERTER FOR CONVERTING AN A.C. VOLTAGE INTO A DIRECT CURRENT AND AN OSCILLATOR CIRCUIT USING SAID CONVERTER

[75] Inventor: Oskar Leuthold, Tschugg, Switzerland

[73] Assignee: Ebauches, Electroniques, S.A., Switzerland

[21] Appl. No.: 305,276

[22] Filed: Sep. 24, 1981

[30] Foreign Application Priority Data

Oct. 16, 1980 [CH] Switzerland .................. 7730/80

[51] Int. Cl.³ .................. H02M 7/217; H03B 5/36
[52] U.S. Cl. .................. 363/127; 307/261; 328/26; 331/116 FE; 331/108 C
[58] Field of Search .................. 363/125, 127, 147; 328/26, 28; 307/261, 279; 331/116 R, 116 FE, 331/108 A, 108 C, 108 D, 158

[56] References Cited

U.S. PATENT DOCUMENTS

| | | | |
|---|---|---|---|
| 3,660,768 | 5/1972 | Dammann et al. | 307/261 X |
| 3,904,988 | 9/1975 | Hsiao | 331/108 C X |
| 4,006,369 | 2/1977 | Taylor | 307/261 |
| 4,015,216 | 3/1977 | Masuda | 331/108 D X |
| 4,053,796 | 10/1977 | van de Plassche | 328/26 X |
| 4,094,137 | 6/1978 | Morokawa | 331/116 FE X |
| 4,096,496 | 6/1978 | Numata et al. | 331/116 FE |
| 4,097,767 | 6/1978 | Blackmer et al. | 328/26 X |
| 4,314,326 | 2/1982 | van de Grift | 363/127 |

Primary Examiner—Peter S. Wong
Attorney, Agent, or Firm—Allegretti, Newitt, Witcoff & McAndrews, Ltd.

[57] ABSTRACT

A converter (300) for converting an a.c. voltage (SP) into a direct current ($i_3$), characterized in that it comprises a first elementary converter (21) which, in response to the a.c. voltage (SP), provides a pulsed direct current ($i_1$), the mean value ($\bar{i}_1$) of which is a steeply rising function of the amplitude A of the a.c. voltage (SP), and a second elementary converter (22) which, in response to the current $i_1$ provides a current $i_3$, the value of which is a steeply falling function of $\bar{i}_1$.

Used for regulating the amplitude of the oscillation signal of an oscillator.

7 Claims, 3 Drawing Figures

CONVERTER FOR CONVERTING AN A.C. VOLTAGE INTO A DIRECT CURRENT AND AN OSCILLATOR CIRCUIT USING SAID CONVERTER

BACKGROUND OF THE INVENTION

The present invention concerns a converter for converting an a.c. voltage into a direct current, of the type comprising supply terminals, an input terminal and an output terminal.

The invention also concerns an oscillator circuit using said converter and comprising:
- a sustain circuit including an input terminal, an output terminal, supply terminals, terminals for connecting a resonator, at least one active amplifier element, and polarization means for said active element, said means comprising a controllable current source connected in series with the controlled current path of the active element, said current source having a control terminal, and
- a regulator circuit acting on the control terminal of the current source in response to one of the following oscillation signals: input signal and output signal of the oscillator, so that the current source produces a current, the value of which falls in dependence on the amplitude of the pilot signal.

More particularly, the invention concerns oscillators having a very low level of current consumption, which are used in watches.

In oscillators of this kind, the regulator circuit maintains the amplitude of the oscillation signal at a low value in order to minimize the current consumption of the oscillator. However, the amplitude of the oscillation signal must be sufficient to permit that signal to be used in subsequent circuits such as: amplifiers, frequency divider, etc.

The article by E. A. VITTOZ "Quartz Oscillators For Watches," published in the proceedings of dixieme Congress International de Chronometrie (Tenth International Congress of Chronometry), Geneva, September 1979, volume 3, pages 131-140, describes an oscillator circuit of the above-indicated type. That known circuit, which is shown in FIG. 1, comprises a circuit 1 for sustaining the vibrations of a quartz resonator 2, and an amplitude regulator 3. The sustain circuit 1 comprises a MOS amplifier transistor 4 which is polarized by a resistor 5; the drain-source path of the transistor 4 is connected in series with that of another MOS transistor 6, between the terminals +V and −V of a supply voltage source. The transistor 6 acts as a controllable current source supplying power to the amplifier transistor 4 of the sustain circuit 1. The control terminal of the current source 6, which is the gate 6a of the transistor 6, receives a control signal which is provided by the regulator circuit 3 which itself receives, at its input 3a, by way of a decoupling capacitor 7, a signal which is referred to as a pilot signal for the oscillator and which appears at an input terminal 8 of the oscillator circuit. The regulator circuit 3 comprises four MOS transistors 9 to 12 which are connected in pairs in mirror image arrangement and which form a closed loop, the gain of which is limited by a resistance means formed by a fifth transistor 13. The regulator circuit 3 and the transistor 6 together form a converter for converting an a.c. input voltage into a direct current. By virtue of its very design, this converter requires a system for polarization of the transistors, comprising resistors 14 and 15 of very high value, which are formed by diodes produced in polycrystalline silicon. The result of this is that the known circuit can be produced only in a special form of circuit technology.

It is for this reason that an object of the present invention is in particular to propose a converter of that type, which can be produced by any form of circuit technology.

SUMMARY OF THE INVENTION

According to the invention, this object is achieved in that the converter comprises a first elementary converter which produces, in response to the a.c. input voltages, a pulsed direct current $i_1$, the value $\overline{i_1}$ of which is a steeply rising function of the amplitude A of said a.c. voltage, and a second elementary converter which produces, in response to the current $i_1$, a current $i_3$, the value of which is a steeply falling function of $\overline{i_1}$, the function being such that, in a certain range of values of A, there is substantially:

$$i_3 = C_1(A_M - A)$$

in which $C_1$ is a current parameter and $A_M$ is a particular value of A, in said range of values.

Advantageously, the first elementary converter is so arranged as to produce a current $i_1$ such that $\overline{i_1} = i_{10} \exp A/U_c$ in which $i_{10}$ and $U_c$ are constant parameters, and the second elementary converter is so arranged as to provide a current $i_3$ such that $i_3 = i_{30} - C_1 \ln(i_1/i_{10})$ in which $i_{30}$ is a constant.

The result of this is:

$$i_3 = i_{30} - C_2(A/U_c),$$

in which $C_2$ is a constant.

This value of $i_3$ is therefore indeed a linearly falling function of A.

The exponential and logarithmic characteristics respectively of the converters may each be achieved, to a first approximation, by means of MOS transistors operating substantially in a low reverse mode without requiring the use of high-value resistors. Indeed, it is well known that an MOS transistor to which there is applied a gate-source polarization voltage, the value of which is lower than that of the theoretical threshold, that transistor supplies, at its drain-source path, a current, the value of which is an exponential function of that of the polarization voltage.

In accordance with a particular illustrative embodiment, the first elementary converter comprises a first MOS transistor, the gate of which is connected to the input terminal of the converter by way of decoupling capacitor, and polarization means for said first transistor. The polarization means advantageously comprise a circuit which is responsive to the a.c. input voltage to apply between the gate and the source of the MOS transistor, a polarization voltage whose mean value is a substantially linear function of the amplitude A of the a.c. voltage.

The polarization circuit advantageously comprises: a second MOS transistor, one of the channel terminals of which is connected to the gate of the first transistor, and a polarization circuit for said second transistor, so arranged to apply between the second channel terminal and the gate of the second transistor, a constant voltage which is so selected that the impedance of the second transistor is high.

In accordance with an embodiment of the invention, the second elementary converter comprises a third, fourth and fifth MOS transistors, polarization means for the third transistor, responsive to the current flowing in the fourth transistor to apply between the gate and the source of the third transistor, a control voltage which is a linear function of the mean value of said current flowing in the fourth transistor, said control voltage being such that the second transistor always operates in a low reverse mode, the fourth and fifth transistors having their gates connected together and their sources connected to the same supply terminal, the drain of the fifth transistor being connected to the output terminal of the converter, and polarization means for the fourth transistor, responsive to the current $i_1$ provided by the first converter to apply to the fourth transistor, a gate-source polarization voltage such that the mean value of the current flowing in the third transistor is equal to the mean value $\bar{i_1}$ of the current $i_1$.

In accordance with a particular embodiment of the second elementary converter, the drains of the first and third transistors are connected together and to the gate of the fourth transistor and to a plate of a capacitor, the other plate of which is connected to a first supply terminal, the gate of the third transistor receives a constant potential while the source of the third transistor is connected to the drain of the fourth transistor and to a terminal of a resistor, the other terminal of which is connected to the second supply terminal, the source of the fourth transistor being connected to said first supply terminal, the components of the circuit (300) being so dimensioned that the current flowing through the fourth transistor is generally high with respect to that flowing in the third transistor.

This converter is advantageously used in an oscillator circuit comprising first and second supply terminals, a sustain circuit including an input terminal, an output terminal, first and second terminals for connecting a resonator, at least on active amplifier element and polarization means for said active element, characterized in that it further comprises a converter as described hereinbefore, responsive to one of the following oscillation signals, referred to as pilot signal (SP): input signal and output signal of the oscillator, to apply to the controlled current path of the active element, a current ($i_3$), the value of which, in dependence on the amplitude (A) of the pilot signal (SP) is of the following form, in a certain range of values of A:

$$i_3 = C_1(A_M - A)$$

in which $C_1$ is a constant parameter and $A_M$ is a particular value of A in said range of values.

BRIEF DESCRIPTION OF THE DRAWINGS

The features and advantages of the invention will be more clearly apparent from the following description of an illustrative embodiment of the invention, with reference to FIGS. 2 and 3 of the accompanying drawings in which.

DETAILED DESCRIPTION OF A PREFERRED EMBODIMENT

Figure 1:
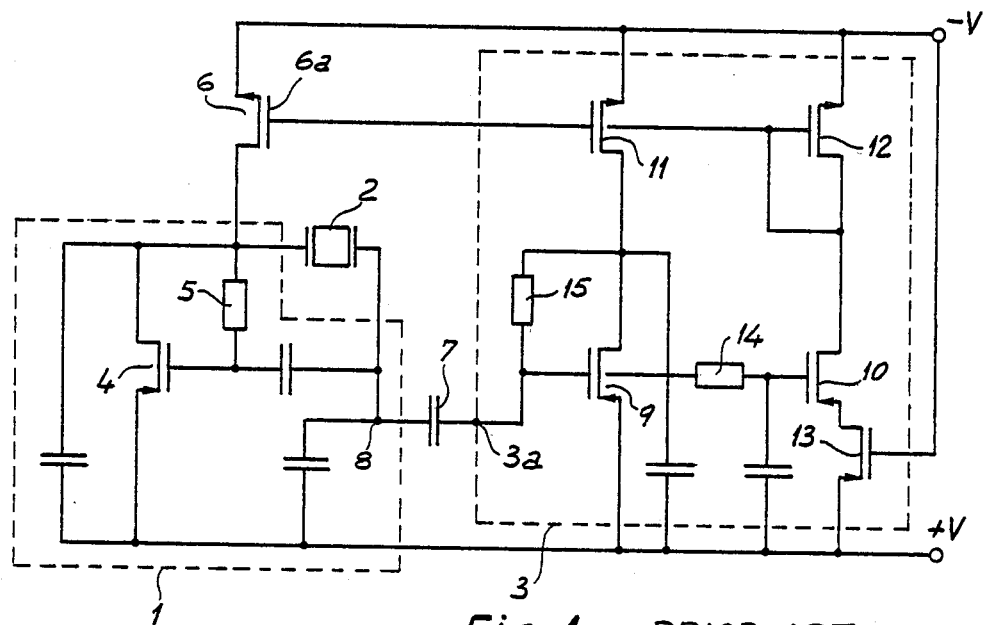
FIG. 1 which has already been described, shows the electrical circuit diagram of an oscillator circuit in accordance with the prior art.
Figure 2:
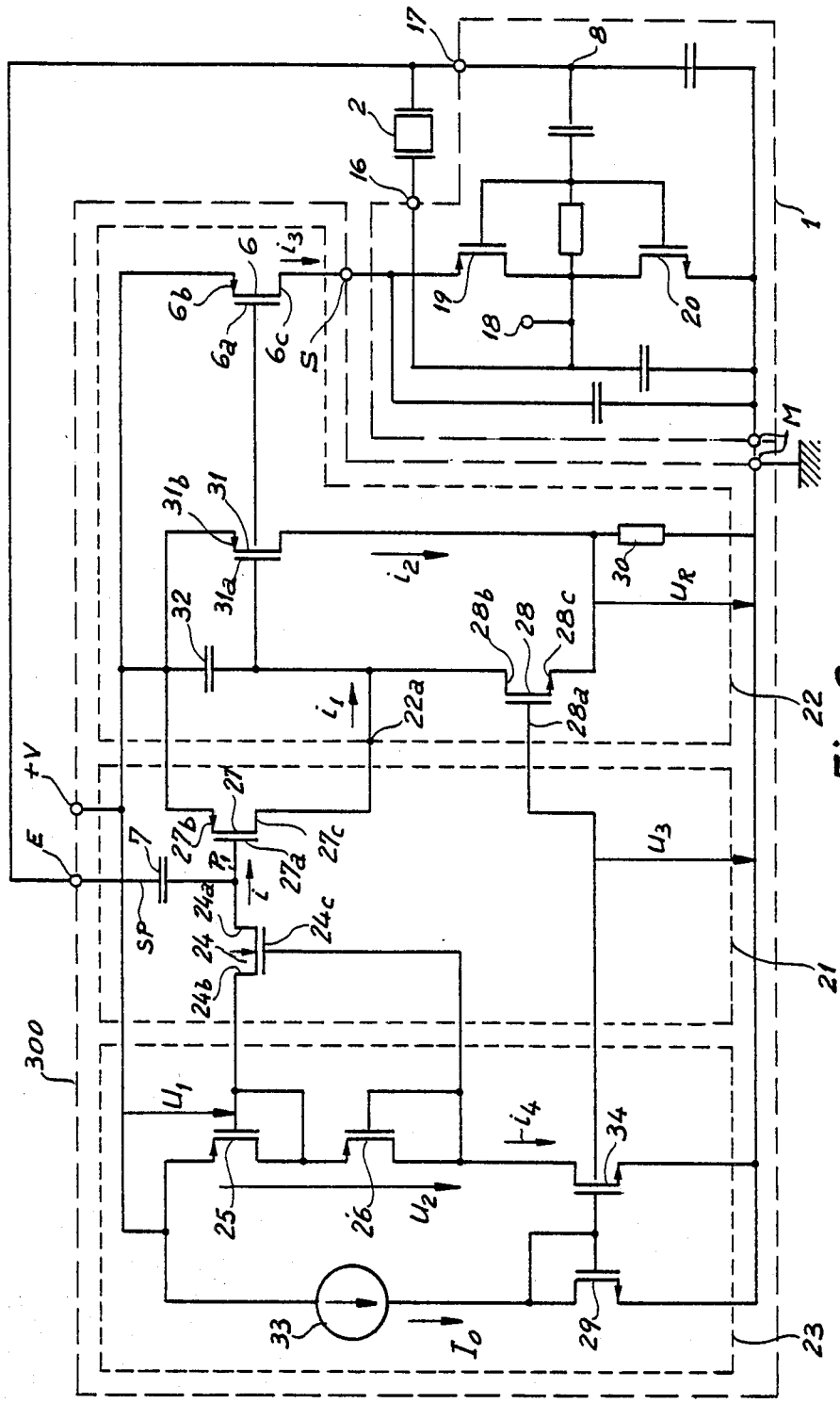
FIG. 2 is an electrical circuit diagram of an oscillator circuit in accordance with one embodiment of the invention.

Referring to FIG. 2, elements which are similar to those of the circuit shown in FIG. 1 are denoted by the same references. Like the circuit shown in FIG. 1, the circuit shown in FIG. 2 comprises a first supply terminal $+V$ and a second supply terminal M, a sustain circuit 1 including terminals 16 and 17 for connecting a resonator 2, an input terminal 8 and an output terminal 18. The sustain circuit shown in FIG. 2 comprises two complementary MOS transistors 19 and 20 which are connected in an inverter arrangement. This type of inverter circuit is known per se, and will not be described in greater detail herein.

Just as in the circuit shown in FIG. 1, a current source which is in the form of an MOS transistor 6 is connected in series with the drain-source paths of the active elements 19 and 20. The control terminal (gate 6a) of the current source 6 receives a control signal provided by a regulator circuit which, with the current source 6, forms a converter 300 for converting an a.c. input voltage SP into a direct current $i_3$, the structure of the converter being fundamentally different from that of the converter shown in FIG. 1.

As shown in FIG. 2, the converter 300 comprises three parts: a voltage-current converter part 21, a current-current converter part 22 and a polarization circuit 23.

The part 21 comprises an MOS transistor 24, a channel terminal 24a of which receives, by way of a capacitor 7, the oscillation signal SP or pilot signal at the input terminal 8 of the sustain circuit 1. The other channel terminal 24b receives a constant potential $U_1$ supplied by the polarization circuit 23, and the gate 24c of the transistor 24 receives a constant potential $U_2$ supplied by the polarization circuit 23. The voltage $U_1$ is supplied by a p-channel MOS transistor 25, the gate of which is connected to the drain and the source of which is connected to the terminal $+V$. In regard to absolute value, the potential $U_2$ is higher than the potential $U_1$ by about a threshold voltage value. The potential $U_2$ is supplied by a second p-channel MOS transistor 26, the gate of which is connected to the drain and the source of which is connected to the drain of the transistor 25.

In the rest condition, the signal SP is zero and the p-channel transistor 24 is controlled by a gate-source voltage which is of the order of magnitude of a threshold voltage so that the transistor 24 will behave like a high-value resistor through which a very low current flows. When the oscillator oscillates, the signal SP is different from zero and the operation of the transistor 24 will be different depending on the sign of the signal SP which is applied thereto at its channel terminal 24a. In the graph shown in FIG. 3, the abscissae denote the potential difference between the potential $U_A$ of the terminal 24a and the potential $U_B$ of the terminal 24b of the transistor 24, while the ordinates show the current i flowing in the drain-source path of the transistor 24.

Figure 3:
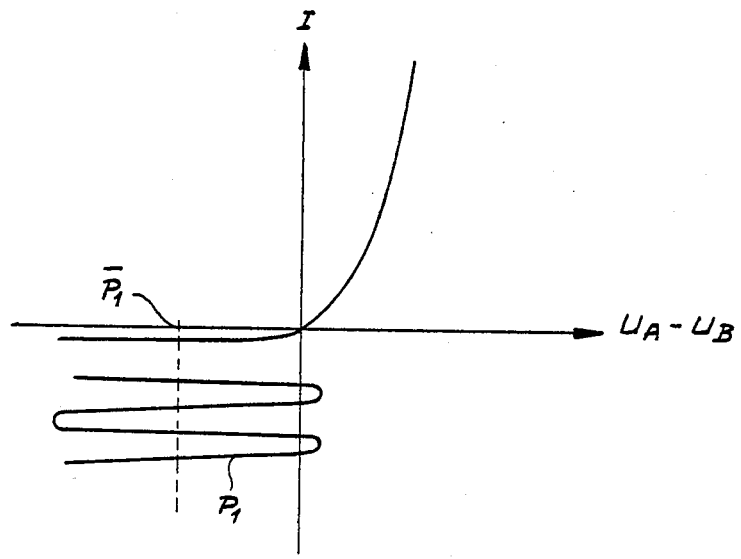
FIG. 3 shows the graph of the drain-source current of a transistor of the first converter in dependence on the potential difference between the two channel electrodes of that transistor.

The mode of operation of the transistor 24 is as follows: during the negative half-cycles of the signal SP, the terminal 24a is negative with respect to the terminal 24b so that a small current which is substantially independent of the value of the potential of the terminal 24a flows through the transistor 24. During the positive half-cycles of the signal SP, the terminal 24a becomes positive with respect to the terminal 24b so that the current i flowing through the transistor 24 increases exponentially in dependence on the potential of the terminal 24a. However, because of the provision of the capacitor 7, the charge idt during a negative half-cycle must be equal to the charge during a positive half-cycle of the signal SP. The result of this is that the terminal 24a becomes positive with respect to the terminal 24b only during a very short period of time which coincides with the positive points of the signal SP. During that period of time, the potential of the terminal 24a remains close to that of the terminal 24b, that is to say, the potential of the terminal 24a remains close to the value $U_1$. Thus, the voltage signal $P_1$ at the terminal 24a, as shown in FIG. 3, is of a mean value $\overline{P_1}$, the value of which is a substantially linear function of the amplitude A of the signal SP.

The signal $P_1$ is applied to the gate 27a of a p-channel transistor 27, the source 27b of which is connected to the supply terminal +V and the drain 27c of which is connected to the input terminal 22a of the current-current converter circuit 22. The transistor 27 supplies the converter 22 with a pulsed direct current $i_1$, the mean value $\overline{i_1}$ of which is heavily dependent on the amplitude A of the alternating input signal SP.

By virtue of the non-linear characteristic of the transistor 27, the current $i_1$ that it supplies increases as an exponential function with the absolute value of the voltage signal $P_1$ applied to its gate 27a. In fact, even if the mean value $\overline{P_1}$ of the voltage signal $P_1$ remains constant, the increase in the current $i_1$ during the negative half-cycle of the signal SP greatly exceeds the reduction in current $i_1$ during the positive half-cycle of the signal SP. However, since the mean voltage $\overline{P_1}$ also falls with the amplitude A of the signal SP, the current $i_1$ increases considerably in dependence on that amplitude A.

The function of the current-current converter is to produce, in response to the current $i_1$ supplied by the transistor 27, a current $i_3$, the value of which is a falling function of $i_1$. In addition, $i_3$ must become zero for a given value $A_M$ of the amplitude of the input signal SP and, in a wide range close to zero, it must fall approximately linearly in dependence on the amplitude A of the input signal SP.

It should be noted that the amplitude regulator 30 is used in a loop system which does not necessarily have to be stable. In that assembly, it is desirable that the transfer function of the regulator circuit should be properly defined and remain reproducible, in spite of the influence of the circuit production process parameters.

The current-current converter 22 comprises an n-channel MOS transistor 28, the gate 28a of which receives a constant potential $U_3$ suplied by an n-channel MOS transistor 29, the gate of which is connected to the drain while the source is connected to the supply terminal M. The drain 28b of the transistor 28 is connected to the input 22a of the converter 22. The transistor 28 is therefore controlled by a voltage $U_R$ applied to the source 28c thereof.

As is known, when the transistor 28 operates in a low reverse mode, there is an exponential dependency between the current flowing in the transistor 28 and the control voltage $U_R$ of the transistor 28. The voltage $U_R$ is produced by the voltage drop due to the flow of a current $i_2$ in a resistor 30, the current $i_2$ being supplied by a p-channel MOS transistor 31, the drain-source path of which is connected in series with the resistor 30 between the supply terminals +V and M.

The gate 31a of the transistor 31 is connected to the input 22a of the converter 22 and to a plate of a capacitor 32, the other plate of which is connected to the supply terminal +V. The purpose of the capacitor 32 is to maintain the voltage of the gate 31a and therefore the voltage of the drain 28b of the transistor 28 substantially constant for a period of the input signal SP.

The components of the circuit 300 are so dimensioned that the current flowing in the transistor 28 can generally be considered negligible with respect to the current flowing in the transistor 31.

The transistors 28 and 31 form a negative feed-back loop system, as will be described hereinafter.

A current $i_1$ which is injected at the input 22a of the converter 22 discharges the capacitor 32 so that the potential of the terminal 22a increases and the current flowing in the transistor 31 decreases. Consequently, the control voltage $U_R$ becomes lower so that the current in the transistor 28 rises, the effect of which is that, in the equilibrium condition of the circuit, the current flowing in the transistor 28 is equal to the curent $i_1$ injected at the terminal 22a.

By virtue of the non-linear characteristic of the transistor 28, for an exponential increase in the current $i_1$ supplied, the control voltage $U_R$ must fall linearly, which means that the current flowing in the transistor 31 also falls linearly.

As the current $i_1$ supplied by the transistor 27 also rises as an exponential function of the amplitude A of the input signal SP, the result is that the current $i_2$ supplied by the transistor 31 falls approximately linearly in dependence on the rising amplitude A of the signal SP.

The transistor 6 may be of such a size with respect to the transistor 31 as to supply a suitable current $i_3$ for controlling the sustain circuit 1.

The transistors 25, 26 and 29 which supply the constant voltages $U_1$, $U_2$ and $U_3$ are part of the polarization circuit 23 which further comprises a current source 33 connected in series between the supply terminals +V and M with the drain-source path of the transistors 29, and a fourth n-channel transistor 34, the drain-source path of which is connected between the supply terminal M and the drain of the transistor 26.

It is advantageous for the circuit 300 to be set out in the following manner:

The transistors 28, 29 and 34 are of the same geometry and the transistor 25 is n times bigger than the transistor 27. In that case, it can be shown that, when A=0, the following applies:

$$i_1 = i_{10} = (i_4/n) = (I_o/n)$$

in which $I_o$ is current supplied by the source 23 and $i_4$ is the current flowing in the transistors 25, 26 and 34.

Typically, $\overline{i_1}$ is multiplied by 100 when A varies from 0 to 400 mV; this means that n=100, $A_M$ being equal to 400 mV.

The sources 6b and 31b of the transistors 6 and 31 are connected to the supply terminal +V while the drain 6c of the transistor 6 is connected to the output terminal S of the converter 300. The transistor 6 is of p-channel type.

By means of suitable dimensioning of the resistor 30 and the transistor 6, it is possible to regulate the starting current $i_{30}$ supplied by the transistor 6, to the desired value.

It should be noted that the value $I_o$ of the current supplied by the current source 33 of the polarization circuit 23 does not play any part as long as the transistors 28, 29 and 34 are operating in a low reverse mode. Therefore, there is no need for the current $I_o$ to be stabilized for example with respect to the fluctuations in the supply voltage provided by the terminals +V, M. The threshold voltages of the transistors are also not involved. Only involved in the transfer function of the converter 300 is the transconductance of the transistors 24 and 27; however, the transconductance is a characteristic enjoying good reproducibility, which is sufficient in all situations for the use envisaged here.

What is claimed is:

1. A converter for converting an a.c. voltage having an amplitude A into a direct current, comprising:
    a first supply terminal;
    a second supply terminal;
    an input terminal for receiving the a.c. voltage;
    an output terminal for outputting the direct current $i_3$;
    a first elementary converter connected to said input terminal for receiving the a.c. voltage, said first elementary converter producing a pulsed direct current, the mean value of which is a steeply rising function of the amplitude A of the a.c. voltage; and
    a second elementary converter connected to said first elementary converter for receiving said pulsed direct current for producing at said output terminal the current $i_3$, the value of which is a steeply falling function of said means value of said pulsed direct current such that there is in a certain range of values of A, substantially:

$$i_3 = C_1(A_M - A)$$

in which $C_1$ is a constant parameter and $A_M$ is a particular value of A in said range of values.

2. A converter according to claim 1 characterized in that the first elementary converter comprises a first MOS transistor having a gate, a drain and a source, the gate of said transistor being connected to the input terminal of the converter by way of a decoupling capacitor, and a polarization means for said first transistor.

3. A converter according to claim 2 characterized in that said polarization means comprise a circuit which is responsive to the a.c. voltage for applying between the gate and the source of said first MOS transistor, a polarization voltage, the mean value of which is a substantially linear function of the amplitude of the a.c. voltage.

4. A converter according to claim 3 characterized in that the polarization circuit for the first transistor comprises: a second MOS transistor having a gate and a pair of channel terminals formed of a drain and a source, one of the channel terminals being connected to the gate of the first MOS transistor, and wherein said polarization means includes a polarization circuit for said second MOS transistor, arranged to apply a constant voltage selected so that the impedance of the second MOS transistor is high.

5. A converter according to claim 4 characterized in that the second elementary converter comprises a third MOS transistor, a fourth MOS transistor and a fifth MOS transistor, each of said third, fourth and fifth MOS transistors having a gate, a source and a drain, and further including a polarization means for polarizing the third transistor, responsive to a current flowing in the fourth transistor to apply between the gate and the source of the third transistor, a control voltage which is a linear function of the last named current flowing in the fourth transistor, the fourth and fifth transistors having their gates connected together and their sources connected to said first supply terminal, the drain of the fifth transistor being connected to the output terminal of the converter,
    and said polarization means being responsive to said pulsed direct current supplied to the first converter for applying to the fourth transistor a gate-source polarization voltage such that the mean value of the current flowing in the third transistor is equal to the mean value of the pulsed direct current supplied by the first elementary converter.

6. A converter according to claim 5 and further including a capacitor formed of a pair of plates; and a resistor having a pair of terminals; and wherein the drains of the first and third transistors are connected together and to the gate of the fourth transistor and to a plate of the capacitor, the other plate of which is connected to the first supply terminal; and wherein the gate of the third transistor is for receiving a constant potential while the source of said third transistor is connected to the drain of the fourth transistor and to a terminal of the resistor, the other terminal of which is connected to the second supply terminal, and the source of the fourth transistor is connected to said first supply terminal.

7. An oscillator circuit comprising the converter according to claim 1; a sustain circuit comprising: an oscillator input terminal for receiving an oscillator input signal; an oscillator output terminal for outputting an oscillator output signal; a sustain first terminal; a sustain second terminal; a resonator connected between said sustain first and said sustain second terminals; at least one active amplifier element; and polarization means for said active amplifier element; said converter being connected to said sustain circuit for being responsive to one of the following oscillation signals: said oscillator input signal and said oscillator output signal, to apply to said active element, said direct current.

* * * * *